United States Patent [19]

Fleischer et al.

[11] Patent Number: 4,492,935
[45] Date of Patent: Jan. 8, 1985

[54] SWITCHED CAPACITOR OSCILLATOR FORMED BY A DAMPED RESONATOR WITH SATURABLE FEEDBACK

[75] Inventors: Paul E. Fleischer, Little Silver, N.J.; Apparajan Ganesan, Indianapolis, Ind.; Kenneth R. Laker, Staten Island, N.Y.

[73] Assignee: AT&T Bell Laboratories, Murray Hill, N.J.

[21] Appl. No.: 474,685

[22] Filed: Mar. 11, 1983

[51] Int. Cl.³ .......................... H03B 5/06; H03C 1/00; H03C 3/00
[52] U.S. Cl. ....................................... 331/135; 331/143; 331/177 R; 331/183; 332/30 R; 332/31 R; 332/52
[58] Field of Search ................ 331/111, 135, 136, 137, 331/143, 177 R, 179, 183, 182; 332/30 R, 31 R, 52

[56] References Cited

U.S. PATENT DOCUMENTS

| | | | |
|---|---|---|---|
| 3,374,445 | 3/1968 | Gaunt | 331/109 |
| 4,295,105 | 10/1981 | Bingham | 332/31 R X |
| 4,315,227 | 2/1982 | Fleischer et al. | 333/173 |

OTHER PUBLICATIONS

Mikhael, et al., "Switched Capacitor Oscillators With Linear Frequency Control", 1981, IEEE International Symposium on Circuits and Systems, Apr. 27-29 1981, pp. 188-191.

Primary Examiner—Siegfried H. Grimm
Attorney, Agent, or Firm—Volker R. Ulbrich

[57] ABSTRACT

A switched capacitor oscillator is constructed by providing a damped resonator network with a comparator as a nonlinear feedback element by connecting the input of the comparator to the output of a first operational amplifier of the resonator network and connecting the output of the comparator to the input of the resonator network. The comparator thus becomes a saturable positive feedback element for the resonator network. Also disclosed is a startup network for the oscillator and an input network which derives an input from a reference voltage in order to eliminate supply voltage noise and provide precision control of amplitude.

15 Claims, 3 Drawing Figures

4,492,935

SWITCHED CAPACITOR OSCILLATOR FORMED BY A DAMPED RESONATOR WITH SATURABLE FEEDBACK

BACKGROUND OF THE INVENTION

The invention relates generally to electronic oscillators and more particularly to audio oscillators for use in integrated circuits.

Electronic oscillators are useful for constructing transducers, timing circuits, signal generators, etc. Integrated circuits are increasingly being designed in an FET (field-effect-transistor) technology, particularly that using MOS (metal-oxide-silicon) devices. Hence, there is a need for reliable oscillator circuitry particularly suited to MOS technology. While it is possible to adapt a crystal oscillator together with a count-down network to provide such a function, this arrangement does not yield a truly sinusoidal output and for many purposes does not provide sufficient control of output amplitude and choice of frequency for many applications. To alleviate these problems, efforts have been made to construct an oscillator which uses switched capacitor techniques. For the most part, these efforts involve the use of an undamped switched capacitor resonator. Thus far, such an approach has not led to an oscillator with performance suited for most precision applications, primarily due to the difficulty in providing accurate control of amplitude and limiting harmonic distortion, while also assuring proper start-up.

SUMMARY OF THE INVENTION

In accordance with the present invention, a switched capacitor damped resonator is provided with a switched capacitor nonlinear feedback network which comprises a saturable device and which causes the resonator network to oscillate in a well controlled manner.

This arrangement makes it possible to control the frequency of oscillation with high precision and also to accurately control the amplitude by deriving the input signal from at least one amplitude control voltage. By proper design, harmonic distortion can be kept to a very low level. Furthermore, amplitude modulation of the output can be achieved by modulating the amplitude control voltage or voltages referred to above. The oscillator frequency can be varied by changing appropriate capacitors either by switching means or by use of a transducer. Further, the frequency of oscillation can also be controlled by changing the frequency of operation of the switched capacitors.

DETAILED DESCRIPTION

Example 1

Figure 1:
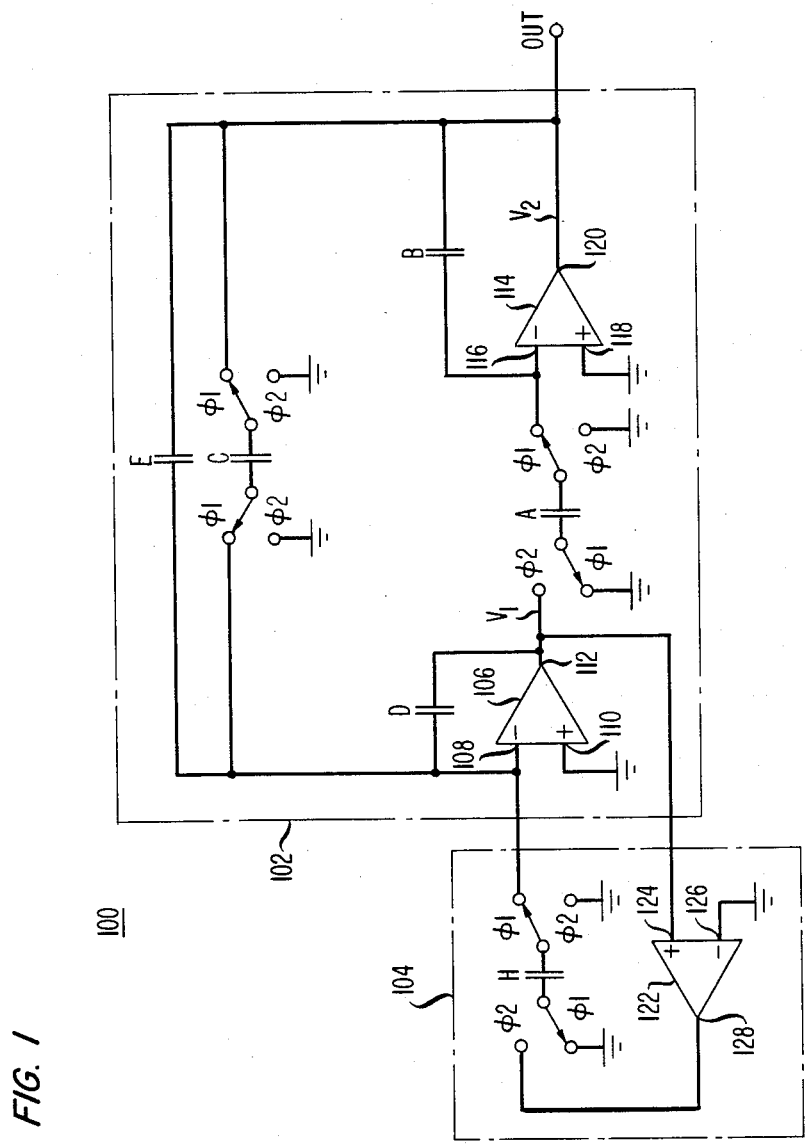
FIG. 1 is a schematic circuit diagram of one example of a switched capacitor oscillator in accordance with the invention.

The oscillator 100 shown in FIG. 1 of the drawings includes two networks which are outlined by broken line rectangular boxes. They are a basic damped resonator network 102 and a positive feedback control network 104.

The oscillator 100 is a switched-capacitor circuit which includes some unswitched capacitors permanently connected in the circuit and some capacitors operating in conjunction with pairs of switches associated therewith. In the interest of simplicity, such a capacitor and the switches associated with it will be regarded herein as a single two terminal switched capacitor element. A switched capacitor element may be a through-switched capacitor or a diagonally-switched capacitor. The term "through-switched" shall be understood to refer to a switched capacitor having two terminals which are short circuited during one of the switching phases, such as by being simultaneously switched to a reference potential, which here is considered to be a.c. (alternating current), or signal ground. During the second switching phase, both capacitor terminals are connected into the resonator network 102. The term "diagonally-switched" shall be understood to refer to a switched capacitor having two terminals which are connected to signal ground alternately during successive switching phases.

The switches of the switched capacitors are typically implemented in the form of FET (field effect transistor) devices in ways well known to those skilled in the art. Therefore, they are represented only symbolically in the drawing, and their particular structure will not be discussed in detail.

The switches of the oscillator 100 are single-pole, double-throw, break-before-make switches shown in one of their two possible switched states in a symbolic form by a short line segment indicating a conduction path between a set of terminals. They are operated by a pair of appropriately timed nonoverlapping pulse trains, $\phi_1$ and $\phi_2$, which change the conductive state of the switches in synchronism to provide the switching function desired. The pulse trains $\phi_1$, $\phi_2$ are considered to be nonoverlapping when the respective switches they control are never in the closed state simultaneously. They may, however, be in the open state simultaneously.

The oscillator 100 of FIG. 1 is shown in the $\phi_1$ switching phase condition. For the $\phi_2$ switching phase condition, all the switches operated by the pair of pulse trains $\phi_1$, $\phi_2$ will be in their only possible other position as would be represented by pivoting the symbolic arrows to the alternate terminal.

The resonator network 102 comprises unswitched capacitors B D, and E; a through-switched capacitor C and, a diagonally-switched capacitor A.

The resonator network 102 which itself includes a first operational amplifier 106 with an inverting input port 108, a noninverting input port 110, and an output port 112. It also includes a second operational amplifier 114 with an inverting input port 116, a noninverting input port 118, and an output port 120. The output port 112 of the first amplifier 106 is connected through the diagonally-switched capacitor A to the inverting input port 116 of the second amplifier 114. The output port 120 of the second amplifier 114 is connected via the through-switched feedback capacitor C to the inverting input port 108 of the first amplifier 106. The output port 120 of the second amplifier 114 is also connected directly through the unswitched damping capacitor E to the inverting input port 108 of the first amplifier 106. The noninverting input ports 110, 118 of both the first and second amplifiers 106, 114 are connected to signal ground. The first amplifier 106, is provided with a local feedback capacitor D, connecting its output port 112 to its inverting input port 108. The second amplifier 114 is provided with a local feedback capacitor B connecting its output port 120 to its inverting input port 116.

The feedback control network 104 comprises a saturable gain feedback element in the form of a comparator 122 having a noninverting input port 124 connected to the output port 112 of the first amplifier 106 and an inverting input port 126 tied to signal ground. The term "saturable gain element" as used herein refers to an element which under normal operating conditions has an output which dwells at its extremes most of the time. This would generally be an operational amplifier, comparator, or other high gain device. Such a device is also considered to be capable of converting a sine wave signal to a useful logic signal. The output port 128 of the comparator 122 is coupled through the diagonally-switched capacitor H to the inverting input port 108 of the first amplifier 106, which is the signal input node of the resonator network 102.

The output nodes of the oscillator 100 are at the output port 112 of the first amplifier 106 having the signal voltage $V_1$ and at output port 120 of the second amplifier 114 having the signal voltage $V_2$. The signal voltage $V_2$ will generally be preferred since it has less harmonic content. Due to a 90 degree phase difference between the signal voltages $V_1$ and $V_2$, it is possible to combine them in various known ways to generate phase shift keyed signals.

The resonator network 102 is actually a basic switched capacitor biquad. The term "biquad" as used herein means a network having a second order transfer function. One such network is shown and described in, for example, U.S. Pat. No. 4,315,227 issued Feb. 9, 1982 to Paul E. Fleischer and Kenneth R. Laker and also assigned to the present assignee. The two amplifiers 106, 114, with their respective feedback capacitors D and B together with the switched capacitors A, and C, provide a basic biquadratic loop. If the unswitched capacitor E and the switched capacitor H were absent, the resonator network 102 would have no damping and would therefore be on the verge of oscillation. Whether it would actually oscillate in practice is not readily determinable. When the unswitched capacitor E is also connected, as shown, it serves as a damping means in the circuit, and hence (assuming capacitor H to be still unconnected) a stable (non-oscillating) circuit is obtained.

When the feedback control network 104 is connected as shown, it provides negative damping, and hence is destabilizing in its effect. The large gain of the comparator 122 results in a signal at the inverting input port 108 of sufficient amplitude to overcome the stabilizing effects of the unswitched capacitor E.

To explain this further, when the signal voltage $V_1$ is small, the comparator 122 represents a large gain, and hence serves to substantially enhance the effective value of the feedback via the switched capacitor H, which is thus effectively made proportional to the gain of the comparator 122. This is destabilizing in its effect, and with proper choice of capacitance values for H and E will cause the oscillator 100 to start oscillating. The growing sinusoidal signals cause the effective gain of this comparator, and thus the effective value of the feedback via the switched capacitor H, to diminish progressively. This decreases its destabilizing effect, and hence will result in an equilibrium condition where the sinusoidal voltage $V_1$ is just large enough to maintain a stable level of oscillating; i.e. the effects of the unswitched capacitors E and the switched capacitor H counterbalance. The oscillator 100 therefore oscillates at a frequency determined by the values of various capacitors.

The comparator 122 provides improved control of the oscillation. Without the comparator 122, the oscillator 100 would still oscillate for a sufficiently large value of the diagonally switched capacitor H, but the amplitude of the output $V_2$ would be dependent on the nonlinear effects introduced by saturation of at least one of the amplifiers 106, 114 and would thus be very poorly controlled. In addition, there would be considerable harmonic content in the output waveform of the oscillator 100. Finally, the frequency of oscillation could not be predetermined as accurately.

It can be seen that with the comparator 122 acting as a non-linear feedback element in the feedback control network 104, the input to the resonator network 102 at the inverting input port 108 of the first amplifier 106 is determined entirely by the saturation of the comparator 122. That is, the switched capacitor H is driven from the output 128 of the comparator 122 by a square wave of the frequency present in the signal $V_1$ fed back from the output port 112 of the first amplifier 106 to the noninverting input port 124 of the comparator 122. The square wave amplitude is determined completely by the saturation levels of the comparator 122, regardless of the sine wave amplitude of the signal voltage $V_1$ at the output port 112 of the amplifier 106. When viewed this way, the oscillator 100 can be regarded as a switched capacitor biquad which is so designed that when it is driven at its input port 108 by a square wave of amplitude A (the amplitude of whose fundamental sine wave component is equal to $(4/\pi)A$), the output voltages $V_1$, $V_2$ are well below the saturation levels of their respective amplifiers 106, 114. As a result, the only harmonics at the output of either one of the amplifiers 106, 114 are those resulting from the harmonics of the square wave input to the first amplifier 106 at the inverting input port 108.

The feedback through the comparator 122 has the effect of making the resonant frequency of the oscillator 100 independent of the values of capacitor elements E and H. Since the only purpose of the unswitched capacitor E is to provide some damping for the resonator 102, it can be so chosen that the resonator has a high Q. The "Q" of a resonator is generally understood in the art as the ratio of its resonant frequency to its bandwidth, with a higher Q indicating less damping. Because the fundamental output is enhanced by the factor Q at either output port 112 or 120, and the response to harmonics falls off at either 6 or 12 dB (deciBells) per octave at port 112 or 120, respectively, very low harmonic distortion is obtainable by designing the resonator to have a high Q.

EXAMPLE 2

Figure 2:
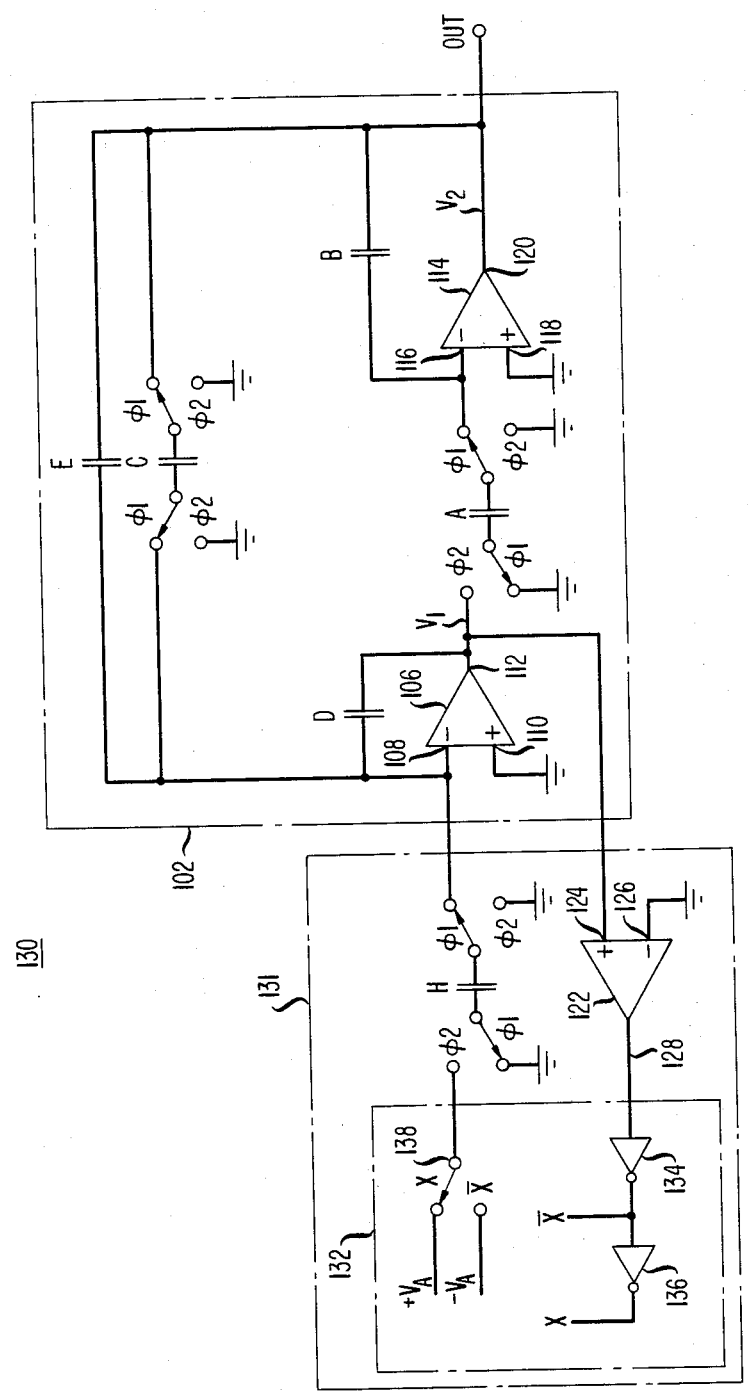
FIG. 2 is a schematic circuit diagram of a second example of an oscillator in accordance with the invention, which provides improved amplitude control of the output.

FIG. 2 shows an oscillator 130 which is designed to provide rejection of power supply voltage variations and hence much better control of the output signal amplitude. Elements of the oscillator 130 which correspond to like elements of the oscillator 100 of FIG. 1 are assigned the same reference symbols.

The oscillator 130 differs from the oscillator 100 of FIG. 1 in that the feedback control network 131 includes a voltage amplitude control network 132 controlled by the output 128 of the comparator 122 and connected to the switched capacitor H. The output 128 of the comparator 122 is connected to an inverter 134, which is in turn connected to another inverter 136. These inverters 134, 136 generate digital logic control signal complements $\overline{X}$ and X, respectively, to operate a switch 138 of the amplitude control voltage network 132. The switch 138 connects the switched capacitor H to one or the other of two amplitude control voltages $+V_A$ and $-V_A$ in response to the signals X and $\overline{X}$, respectively.

The operation of the oscillator 130 is similar to that of the oscillator 100, except that now the amplitude of the square wave input to the switched capacitor H can be precisely established by means of the amplitude control voltages $+V_A$ and $-V_A$. As a result, it is possible to obtain precise control of the oscillator 130 output amplitude. This, in conjunction with the precise frequency stability, which is a known characteristic of switched capacitor filters in general, and the previously referred to very low harmonic distortion capability results in a particularly useful oscillator. The input voltage to the resonator network 102 of the oscillator is not responsive directly to the output signal amplitude of the comparator 122, but is determined instead by the amplitude control voltages $+V_A$ and $-V_A$. Consequently, the output voltage amplitude of the oscillator 130 is substantially unaffected by variations in its power supply voltage. Furthermore, the amplitude control voltages $+V_A$ and $-V_A$ can be trimmed to compensate for manufacturing variations, thus assuring the desired output level.

EXAMPLE 3

Figure 3:
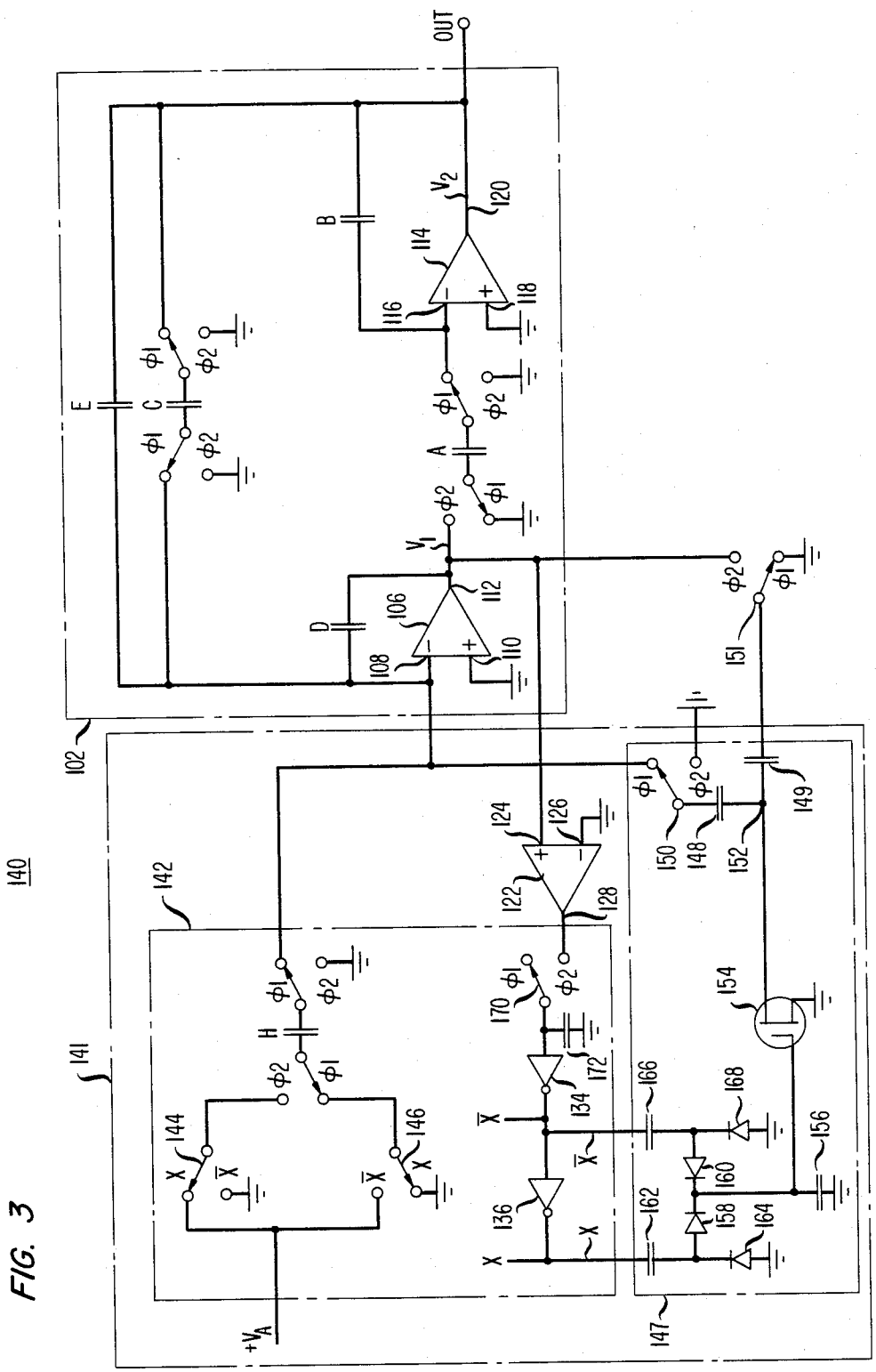
FIG. 3 is a schematic circuit diagram of a third example of an oscillator in accordance with the present invention which requires only a single amplitude control voltage for improved control of the output amplitude and also includes a startup means.

FIG. 3 shows an oscillator 140 with a feedback control network 141 which is designed to provide the advantages of the oscillator 130 of FIG. 2 with an amplitude control voltage network 142 requiring only a single amplitude control voltage $+V_A$. Elements of the oscillator 140 which correspond to like elements of the oscillator 130 of FIG. 2 are assigned the same reference symbols.

The amplitude control voltage network 142 is a parallel network of two switches 144, 146. The one switch 144 selectively connects the switched capacitor H either to an amplitude control potential $+V_A$ or to signal ground in response to the control signals X and $\overline{X}$, respectively, during the $\phi_2$ phase. The second switch 146 selectively connects the switched capacitor H either to signal ground or to the amplitude control potential $+V_A$ in response to the control signals X and $\overline{X}$, respectively, during the $\phi_1$ phase. With this arrangement, the single amplitude control voltage $+V_A$ is used to effectively replace the $+V_A$ and the $-V_A$ needed for the oscillator 130. In response to the control signal $\overline{X}$, the amplitude control voltage $+V_A$ is connected to the switched capacitor H in the same fashion as in the oscillator 130 of FIG. 2. On the other hand, in response to the control signal $\overline{X}$ the amplitude control voltage $+V_A$ becomes interchanged with ground potential. This results in the injection of charge into the input port 108 of the operational amplifier 106 which is equal in value and polarity to the charge that in the oscillator 130 is injected from the $-V_A$ source in response to to the control signal $\overline{X}$. The elimination of the requirement for a separate $-V_A$ source is advantageous in that if two amplitude control voltages $+V_A$ and $-V_A$ are used, as in the oscillator 130 of FIG. 2, then they must closely track each other in magnitude. Moreover, a single amplitude control voltage $+V_A$ can be readily modulated in known ways if it is desired to thereby modulate the amplitude of the output signal.

The oscillator 140 is also provided with a startup network 147 which includes a pair of startup feedback capacitors 148, 149 connected in series with two switches 150, 151 as feedback between the output 112 and the inverting input 108 of the first operational amplifier 106. The common node 152 of the capacitors 148, 149 is also connected to the drain of an N-channel, enhancement mode, field effect transistor 154. The source of this transistor 154 is connected to the signal ground. The gate of the transistor 154 is connected to one side of an unswitched capacitor 156, the other side of which is connected to signal ground. The one side of the capacitor 156 is also connected to the common node of a pair of diodes 158, 160 connected head-to-head. The other side of the diode 158 is tied to the common node of an unswitched capacitor 162 which has its other side connected to the X output of the inverter 136 and of a diode 164 which has its other side connected to signal ground. The other side of the diode 160 is tied to the common node of an unswitched capacitor 166 which has its other side connected to the $\overline{X}$ output of the inverter 134 and of a diode 168 which has its other side connected to signal ground.

It can be seen from the FIG. 3 that in the absence of oscillations, the control signals X and $\overline{X}$ are constant, and therefore the gate of the transistor 154 will be near signal ground potential, due to the small, but non-zero leakage through the diodes 158, 160, 164, and 168. This leaves the drain-source conduction path of the transistor 154 non-conducting and thereby disconnects the common node 152 of the capacitors 148, 149 from signal ground to activate the feedback path through them. The presence of this feedback path sufficiently destabilizes the resonator network 102 to cause oscillation. As soon as oscillation occurs, the control signals X and $\overline{X}$ become square waves. This results in the transfer of charge to the capacitor 156 via the network of diodes 158, 160, 164, and 168 and the capacitors 162, 166. This raises the gate voltage of the transistor 154 sufficiently so that it becomes conducting. This drives the common node 152 of the capacitors 148, 149 to signal ground and breaks the feedback path through them, so that the startup network 142 is disconnected after having performed its startup function.

The startup network 147 of the oscillator 140 of FIG. 3 can also be included in the oscillator 130 of FIG. 2, if such a feature is desired. It should be understood that a startup network is not generally essential for an oscillator such as those described herein, but rather is a means for improving the reliability of such circuits by assuring oscillation under all start-up conditions.

The oscillator 140 also includes a switch 170 between the output 128 of the comparator 122 of the feedback control network 141 and the input of the inverter 134 and an unswitched capacitor 172 connecting the common node of the inverter 124 and the switch 170 to signal ground. The switch 170 is closed during the $\phi_2$ phase and open during the $\phi_1$ phase. By breaking the feedback during the $\phi_1$ phase, the switch 170 prevents possible dithering due to the continuous feedback path during the $\phi_1$ phase via the switch 146 if $\overline{X}$ is asserted. However, it should be noted that such dithering is actually quite unlikely, and therefore the switch 170 probably need not be provided. The switch 170 also serves to reduce jitter attributable to unequal delay of the input signal to the inverting input port 108 of the first amplifier 106 via the switched capacitor H.

While in the examples 1, 2 and 3 above the nonlinear element of the feedback control networks 104, 131, and 141 is the comparator 122, it could, of course, alternatively be an operational amplifier.

In the above-described examples of the invention, the schematic circuit diagrams are presented with their switches connected in a manner which facilitates an understanding of the operation of the circuit. In actual practice, a particular circuit design would generally permit some simplification by a sharing of switches in known ways to reduce the total number. Examples of such sharing are discussed, for example in the above mentioned U.S. Pat. No. 4,315,227.

Although the above-described oscillators 100, 130, 140 are switched capacitor circuits of the type having two switching phases, they may also be circuits with three, or even more phases.

For any of the oscillators 100, 130, 140 the function of the unswitched damping capacitor can be alternatively served by a through-switched capacitor F connected between the output port 120 and the inverting input port 116 of the second operational amplifier 114. A resonator network having such a capacitor F is described for example in the above-cited patent.

The diagonally switched capacitor H can be replaced by a more complex arrangement which may result in an input at the inverting input port 108 different in magnitude from the amplitude control voltage, but which has a predetermined correspondence to it.

The feedback control networks 104, 131, 141 described above each utilize as their saturable element a comparator 122, which also has a gain. However, the saturable element need not provide gain.

An FM (frequency modulation) signal can be derived from the above oscillators by appropriately modulating one or more parameters of the circuit which affect the resonant frequency of the resonator network.

What is claimed is:

1. An oscillator, comprising
   a switched capacitor damped resonator network having at least one signal input node and at least one signal output node and including at least one amplifier, and
   a switched capacitor nonlinear feedback control network coupling one of said output nodes to one of said input nodes, said feedback control network comprising a saturable device for affecting the waveform of the feedback signal to said resonator network.

2. The oscillator defined in claim 1 wherein said saturable device is a comparator.

3. The oscillator defined in claim 1 comprising resonator startup means connected between an input node and an output node of said resonator network.

4. The oscillator defined in claim 3 wherein said startup means comprises:
   a nonlinear positive feedback path means connecting a signal input node of said resonator to a signal output node of said resonator, and
   means for disabling said feedback path means when said resonator network has started oscillating.

5. The oscillator defined in claim 4 wherein said positive feedback path means comprises a pair of startup feedback capacitors connected in series and said disabling means is adapted to connect the common node of said startup feedback capacitors to signal ground when said resonator network is oscillating and to disconnect it from signal ground when said resonator network is not oscillating.

6. The oscillator defined in claim 5 wherein said disabling means comprises a switch means connected between said common node of said startup feedback capacitors and signal ground and activated to the closed state by the presence of a signal in said nonlinear positive feedback path means.

7. The oscillator defined in claim 6 wherein said switch means comprises a field effect transistor having its gate electrode connected to a capacitor which has one side connected to ground and the other side connected to said nonlinear positive feedback network through a diode network, so that it becomes charged when there is signal present in said nonlinear positive feedback network.

8. The oscillator defined in claim 1 wherein said resonator network comprises:
   first and second operational amplifiers, each having an inverting input port, a noninverting input port, and an output port, one of the input ports of said first operational amplifier forming said signal input node and an output port of one of said operational amplifiers forming said signal output node;
   a diagonally-switched capacitor connecting the output port of the first amplifier to the inverting input port of the second amplifier;
   an unswitched feedback capacitor connected between the output port of the first amplifier and the inverting input port of the first amplifier;
   an unswitched feedback capacitor connected between the output port of the second amplifier and the inverting input port of the second amplifier;
   a through-switched capacitor connected between the output port of the second amplifier and the inverting input port of the first amplifier, and
   damping means.

9. The oscillator defined in claim 8 wherein said damping means comprises an unswitched capacitor connected between the output port of the second amplifier and the inverting input port of the first amplifier.

10. The oscillator defined in claim 1 wherein said nonlinear feedback control network comprises means for detecting the polarity of a signal at an output node of said resonator and generating in response thereto at an input node of said resonator an input signal with a polarity having a predetermined correspondence to the polarity of the output node signal.

11. The oscillator defined in claim 10 wherein said means for detecting comprises at least one comparator which in response to the polarity of said output node signal generates control signals for providing a resonator input node signal of a magnitude with pedetermined correspondence to the magnitude of an amplitude control voltage.

12. The oscillator defined in claim 11 comprising means for modulating the amplitude of the amplitude control voltage.

13. The oscillator defined in claim 11 comprising means for modulating the frequency of oscillation of said resonator network.

14. The oscillator defined in claim 13 wherein said modulating means modulates the frequency with which switched capacitors of said oscillator are switched.

15. The oscillator defined in claim 13 wherein said modulating means modulates the magnitude of at least one capacitor in said resonator network.

* * * * *